United States Patent [19]
Kitagawa et al.

[11] Patent Number: 5,489,860
[45] Date of Patent: Feb. 6, 1996

[54] SEMICONDUCTOR CIRCUIT HAVING IMPROVED LAYOUT PATTERN

[75] Inventors: Masaya Kitagawa; Shigeru Fujii, both of Kawasaki, Japan

[73] Assignee: Fujitsu Limited, Kawasaki, Japan

[21] Appl. No.: 138,081

[22] Filed: Oct. 20, 1993

[30] Foreign Application Priority Data

Oct. 20, 1992 [JP] Japan .................................. 4-282061

[51] Int. Cl.⁶ .................................................. H01L 25/00
[52] U.S. Cl. .......................... 326/103; 257/369; 257/390
[58] Field of Search ............................ 307/482.1, 465.1, 307/303.2; 257/369, 390, 401, 909; 326/102, 103

[56] References Cited

U.S. PATENT DOCUMENTS

| | | | |
|---|---|---|---|
| 4,771,327 | 9/1988 | Usui ......................................... | 257/390 |
| 4,825,273 | 4/1989 | Arakawa ................................. | 257/390 |
| 5,038,192 | 8/1991 | Bonneau ................................. | 257/390 |
| 5,175,605 | 12/1992 | Pavlu ...................................... | 257/369 |

FOREIGN PATENT DOCUMENTS

| | | |
|---|---|---|
| 0131464 | 1/1985 | European Pat. Off. . |
| 3-231462 | 10/1991 | Japan . |

OTHER PUBLICATIONS

*Patent Abstracts of Japan*, vol. 13, No. 155 (E–743) (3503), Apr. 14, 1989 & JP–A–63 313835 (Mitsubishi Electric Corp.), Dec. 21, 1988.

*Patent Abstracts of Japan*, vol. 16, No. 11 (E–1153), Jan. 13, 1992 & JP–A–03 231462 (Horikoshi Kengo), Oct. 15, 1991.

*Primary Examiner*—Edward P. Westin
*Assistant Examiner*—Andrew Sanders
*Attorney, Agent, or Firm*—Staas & Halsey

[57] ABSTRACT

A semiconductor circuit includes a plurality of first power supply lines which are arranged parallel to each other, a plurality of second power supply lines which are arranged parallel to each other and supplying a power supply voltage different from that supplied by the first power supply lines, where the first and second power supply lines run parallel to each other in a first direction, a first cell made up of the same number of first p-channel transistors and first n-channel transistors which are respectively coupled to the first and second power supply lines, where the first p-channel transistors and the first n-channel transistors are alternately arranged in a second direction and have the same size, and a second cell made up of a different number of second p-channel transistors and second n-channel transistors which are respectively coupled to the first and second power supply lines. The second p-channel transistors and the second n-channel transistors are alternately arranged in the second direction, and the second p-channel transistors are electrically coupled in parallel, so that the second p-channel transistors have a predetermined driving capability.

13 Claims, 17 Drawing Sheets

SEMICONDUCTOR CIRCUIT HAVING IMPROVED LAYOUT PATTERN

BACKGROUND OF THE INVENTION

The present invention generally relates to semiconductor circuits, and, more particularly, to a semiconductor circuit having an improved layout pattern.

The present invention especially relates to the layout pattern of a semiconductor circuit which is employed when arranging buffers on a substrate together with 2-row type unit cells which form an ASIC (Application Specific Integrated Circuit). The buffers are used to drive signal lines such as clock signal lines which have a large load within an LSI (Large Scale Integrated) circuit which forms the ASIC, or signal lines of a MCM (Multi Chip Module) which forms the ASIC.

From the point of view of the design technique, the ASIC can be categorized into semi-customized ICs which are made by automatic designing, and full-customized ICs which are made by manual designing. The semi-customized ICs employ the gate array system or the standard cell system, in both of which systems a large portion of the IC is formed by 2-row type unit cells. Each 2-row type unit cell is the minimum combination required to form a unit cell. The 2-row type unit cell is made up of 1-row type cells which are arranged in 2 rows, where each 1-row type cell has a p-channel transistor and an n-channel transistor.

Generally, when designing the ASIC, it is important that the layout pattern satisfies the following conditions which are: (i) the unit cell is easy to form and the wiring is accordingly easy to form; (ii) a large number of unit cells can be formed within the chip.

The condition (i) is satisfied by employing the 2-row type unit cell described above. On the other hand, whether or not the condition (ii) can be satisfied depends on how small the transistor width of the unit cell can be made and how narrow the interval of the unit cells can be made in the chip layout pattern. The minimum interval of the metal wiring is prescribed by the mask design rules. In addition, the wiring within the unit cell utilizes a wiring region which is formed on an upper layer above the transistor. For this reason, the wiring channel on the transistor decreases if the transistor width is decreased, thereby making it difficult to form the unit cell. Accordingly, the transistor width is selected to an appropriate minimum value within a range such that various unit cells can be formed, for both the p-channel and n-channel transistors.

FIG. 1 shows an example of a layout pattern of 2-row type unit cells which are realized by taking the above into consideration. In FIG. 1, a power supply line 1 supplies a power supply voltage $V_{DD}$, and a power supply line 2 supplies a power supply voltage $V_{SS}$. The transistors in the layout pattern include p-channel transistors 5 and n-channel transistors 6. A width $W_P$ of the p-channel transistor 5 and a width $W_N$ of the n-channel transistor 6 are selected such that $W_P = W_N$.

The interval of the unit cells can recently be made narrower than before by employing the so-called over-cell-routing technique, and it has become possible to further improve the integration density of the IC. According to this over-cell-routing technique, the wiring channel is used for the wiring of the chip layout pattern if the wiring channel exists on the upper layer of the unit cell.

However, although the layout pattern shown in FIG. 1 realizes the improved integration density, the transistor widths $W_P$ and $W_N$ of the p-channel and n-channel transistors 5 and 6 are set to the minimum values and are set equal to each other. For this reason, a difference is introduced between the driving capabilities of the p-channel and n-channel transistors 5 and 6. In other words, if the transistors have the same size, the n-channel transistor 6, which uses the electrons having a small effective mass as the carriers, has a larger mobility compared to the p-channel transistor 5, which uses the holes having a large effective mass as the carriers.

The difference between the driving capabilities similarly affects a buffer which is made up of the p-channel and n-channel transistors. For this reason, if a signal line is driven by a buffer which is made up of the p-channel and n-channel transistors having the same transistor width, a time $T_{rise}$ required for the signal waveform to rise and a time $T_{fall}$ required for the signal waveform to fall become different due to the difference between the driving capabilities of the p-channel and n-channel transistors. For example, $T_{rise} > T_{fall}$ as shown in FIG. 2. This difference between the times $T_{rise}$ and $T_{fall}$ does not cause a serious problem if the signal line within the LSI to be driven has a relatively small load. However, if this buffer is used to drive a clock signal line within the LSI having a large load or to drive a signal line of a MCM, the difference between the times $T_{rise}$ and $T_{fall}$ causes problems, such as a change in the duty ratio of the pulses, thereby making it difficult to design the system.

In order to avoid the above described problems, it is known from experience that the transistor width of the p-channel transistor should be made two times the transistor width of the n-channel transistor if the p-channel and n-channel transistors are to have the same driving capability. For example, the layout pattern in this case becomes as shown in FIG. 3 or FIG. 4. In FIGS. 3 and 4, those parts which are the same as those corresponding parts in FIG. 1 are designated by the same reference numerals, and a description thereof will be omitted.

According to the layout patterns shown in FIGS. 3 and 4, a buffer BF is arranged to use the power supply lines 1, 1, 2 and 2 in common with 2-row type unit cells UC. In the case of the layout pattern shown in FIG. 3, the width of a p-channel transistor 7 is extended in a vertical direction Y by a certain distance, so that the width of the p-channel transistor 7 is two times the width $W_N$ of an n-channel transistor 8. On the other hand, in the case of the layout pattern shown in FIG. 4, the length of the p-channel transistor 7 is extended in a horizontal direction X by a certain distance, so that the length of the p-channel transistor 7 is two times the length of the n-channel transistor 8. By using the layout pattern shown in FIG. 3 or FIG. 4, the rise time $T_{rise}$ of the signal waveform which is driven by the buffer BF becomes approximately equal to the fall time $T_{fall}$ of the signal waveform, as shown in FIG. 5.

However, in the layout pattern shown in FIG. 3, the p-channel transistor 7 is merely extended in the vertical direction Y, and the width of the p-channel transistor 7 in the vertical direction Y becomes two times that of the p-channel transistor 5 forming the unit cell UC. As a result, a portion of the p-channel transistor 7 projects a distance H in the vertical direction Y from the power supply line 1. This projecting portion interferes with the narrowing of the interval between the unit cells UC, and introduces a new problem in that the integration density of the entire LSI deteriorates.

On the other hand, in the layout pattern shown in FIG. 4, the p-channel transistor 7 is merely extended in the horizontal direction X, and the length of the p-channel transistor 7 in the horizontal direction X becomes two times that of the p-channel transistor 5 forming the unit cell UC. As a result, an unused region R is formed under the p-channel transistor 7 in the vertical direction Y. This unused region R has a size which is approximately two times that of the n-channel transistor 6 forming the unit cell UC. Because the buffer for driving the clock signal line or the signal line of the MCM needs to have a large size compared to the buffer for driving the wiring within the LSI, the existence of such an unused region R is not negligible from the point of view of improving the integration density of the LSI, and deteriorates the integration density.

SUMMARY OF THE INVENTION

Accordingly, it is a general object of the present invention to provide a novel and useful semiconductor circuit in which the problems described above are eliminated.

Another and more specific object of the present invention is to provide a semiconductor circuit comprising a plurality of first power supply lines which are arranged in parallel to each other, a plurality of second power supply lines which are arranged in parallel to each other and supplying a power supply voltage different from that supplied by the first power supply lines, wherein the first and second power supply lines run parallel to each other in a first direction, a first cell made up of a common number of first p-channel transistors and of first n-channel transistors, which are respectively coupled to the first and second power supply lines, wherein the first p-channel transistors and the first n-channel transistors are alternately arranged in a second direction and have the same size, and a second cell made up of a different number of second p-channel transistors and second n-channel transistors which are respectively coupled to the first and second power supply lines, wherein the second p-channel transistors and the second n-channel transistors are alternately arranged in the second direction, and the second p-channel transistors are electrically coupled in parallel, so that the second p-channel transistors have a predetermined driving capability. According to the semiconductor circuit of the present invention, it is possible to use common power supply lines for a 2-row type unit cell and a buffer within the same transistor width. Hence, it is possible to minimize the unused region in the layout pattern and enable a high integration density to be maintained as in the case where only the 2-row type unit cells are arranged. In addition, it is possible to set the driving capabilities of the p-channel transistors and n-channel transistors to be approximately the same, in use as a buffer, for example. Furthermore, a distance between the p-channel and n-channel transistors of the buffer can be made relatively large so as to avoid the latch-up phenomenon, and, at the same time, to minimize any unused region in the layout pattern.

Other objects and further features of the present invention will be apparent from the following detailed description when read in conjunction with the accompanying drawings.

DESCRIPTION OF THE PREFERRED EMBODIMENTS

A description will be given of a first embodiment of a semiconductor circuit according to the present invention, by referring to FIGS. 6 through 8. In this embodiment, the present invention is applied to a semiconductor circuit having the MCM structure and/or the clock buffer.

According to the MCM structure and/or the clock buffer, a plurality of LSI chips and a plurality of input/output buffers are mounted on a semiconductor substrate. A plurality of 2-row type unit cells are formed in each of the LSI chips. In addition, an equivalent circuit of each input/output buffer becomes as shown in FIG. 8 comprising one (1) p-channel transistor and (1) one n-channel transistor which are connected as shown.

Figure 1:
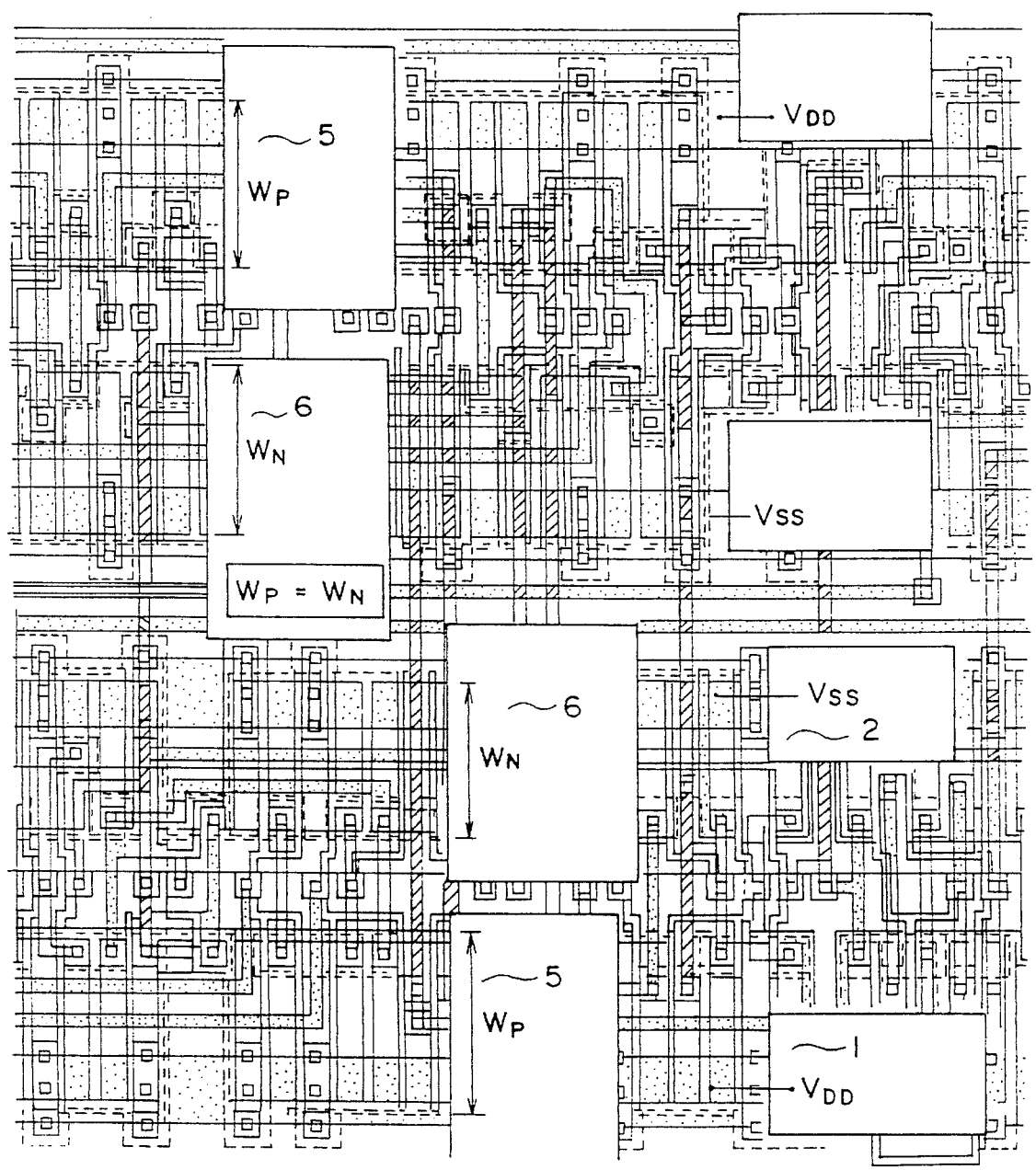
FIG. 1 is a plan view showing an example of a layout pattern in which 2-row type unit cells are independently arranged.
Figure 2:
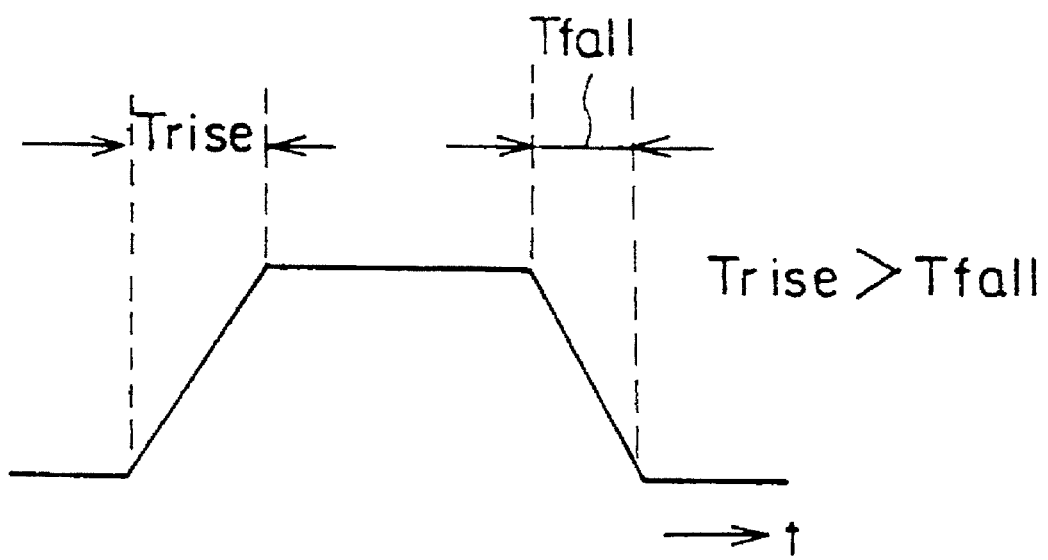
FIG. 2 is a diagram showing a signal waveform for explaining a difference in driving capabilities of p-channel and n-channel transistors.
Figure 3:
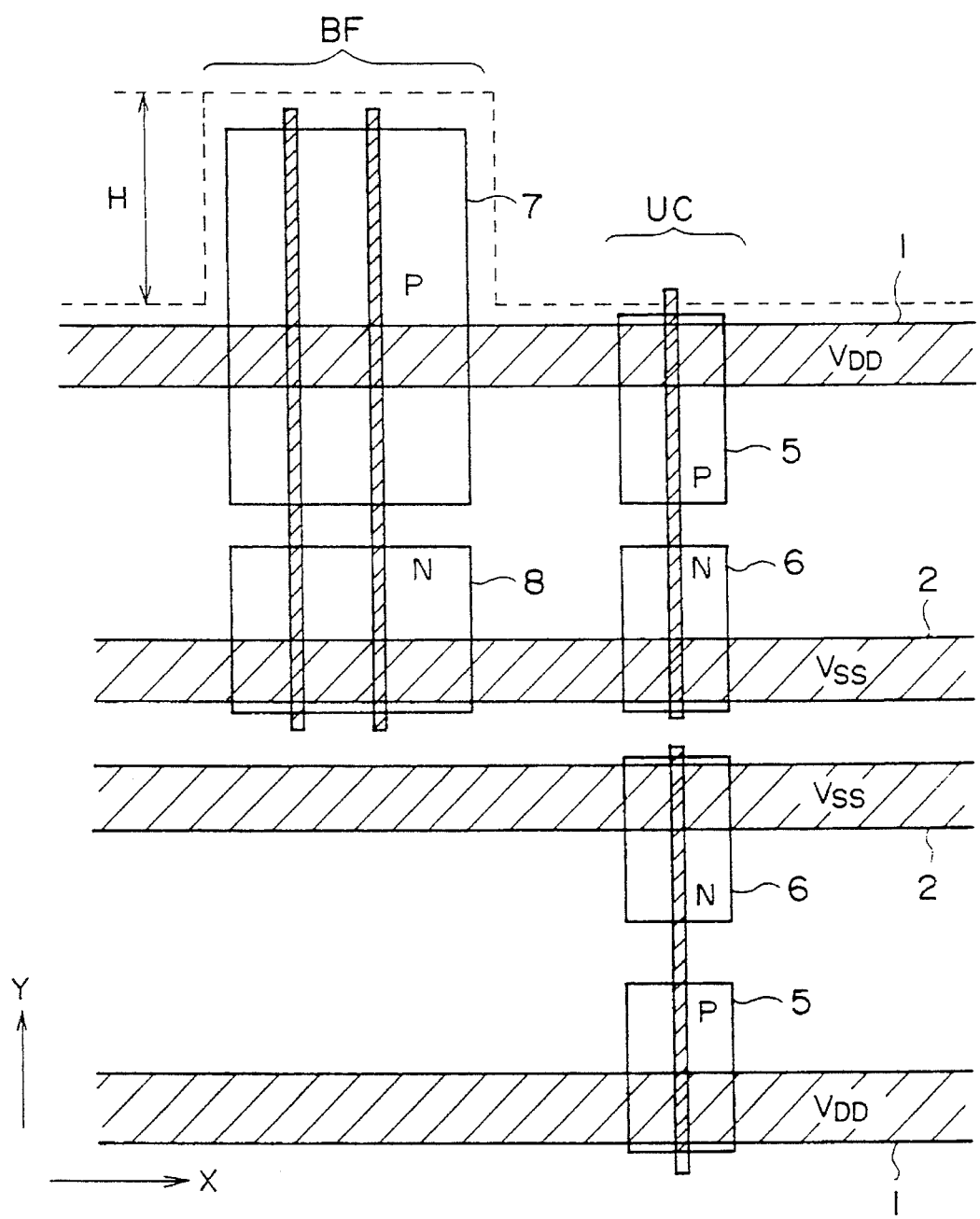
FIG. 3 is a plan view showing an example of a layout pattern for realizing p-channel and n-channel transistors having same driving capability.
Figure 4:
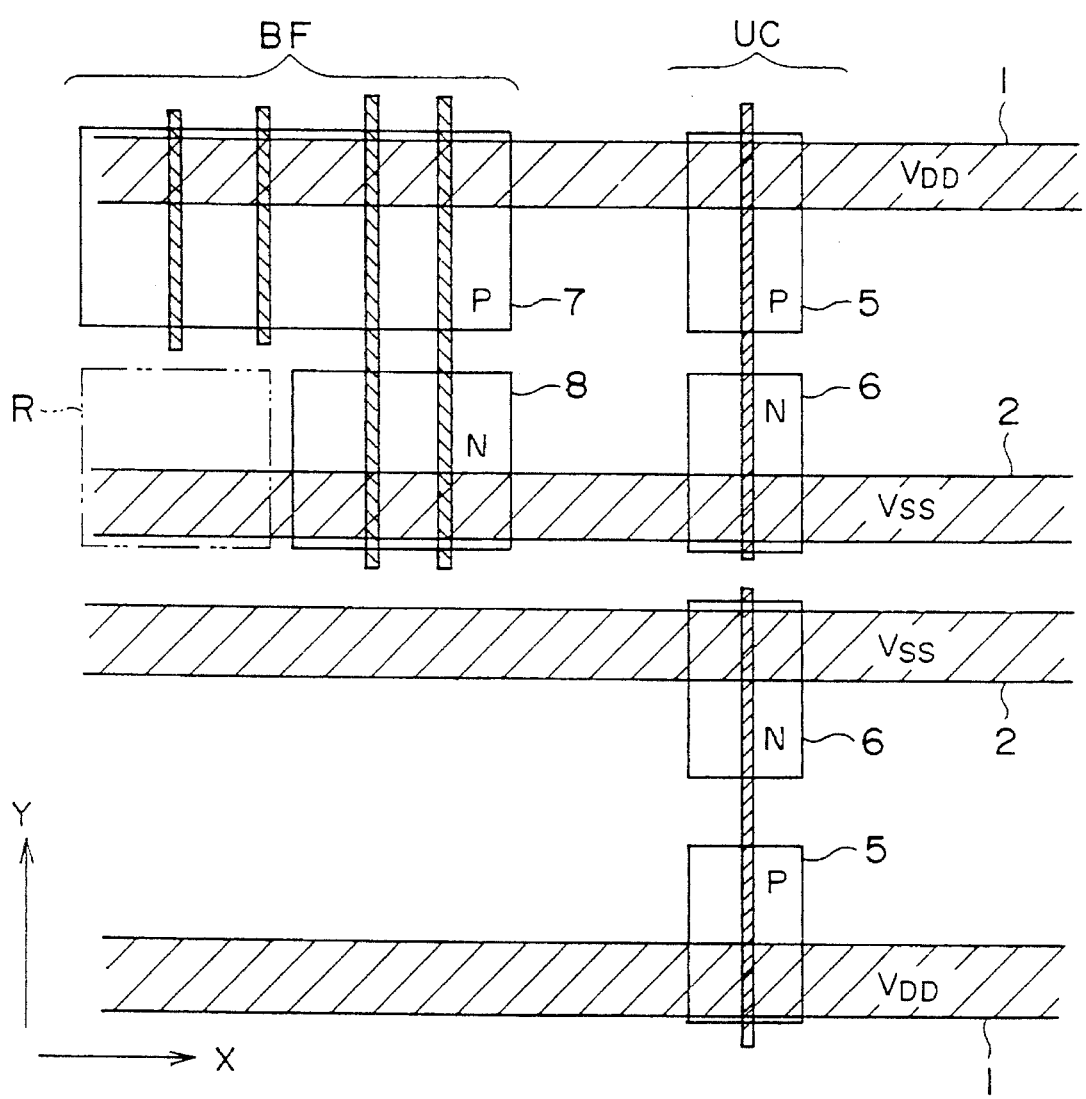
FIG. 4 is a plan view showing another example of a layout pattern for realizing p-channel and n-channel transistors having the same driving capability.
Figure 5:
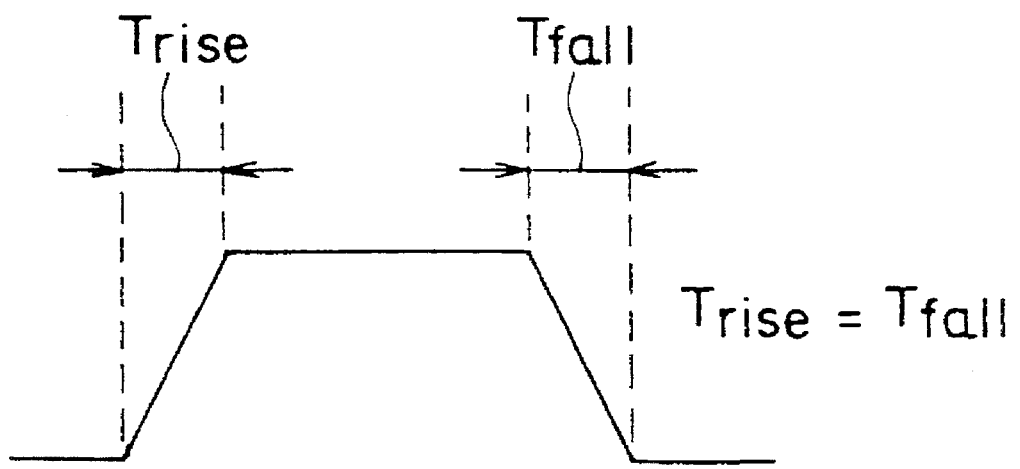
FIG. 5 is a diagram showing a signal waveform for explaining the same driving capability of the p-channel and n-channel transistors.
Figure 6:
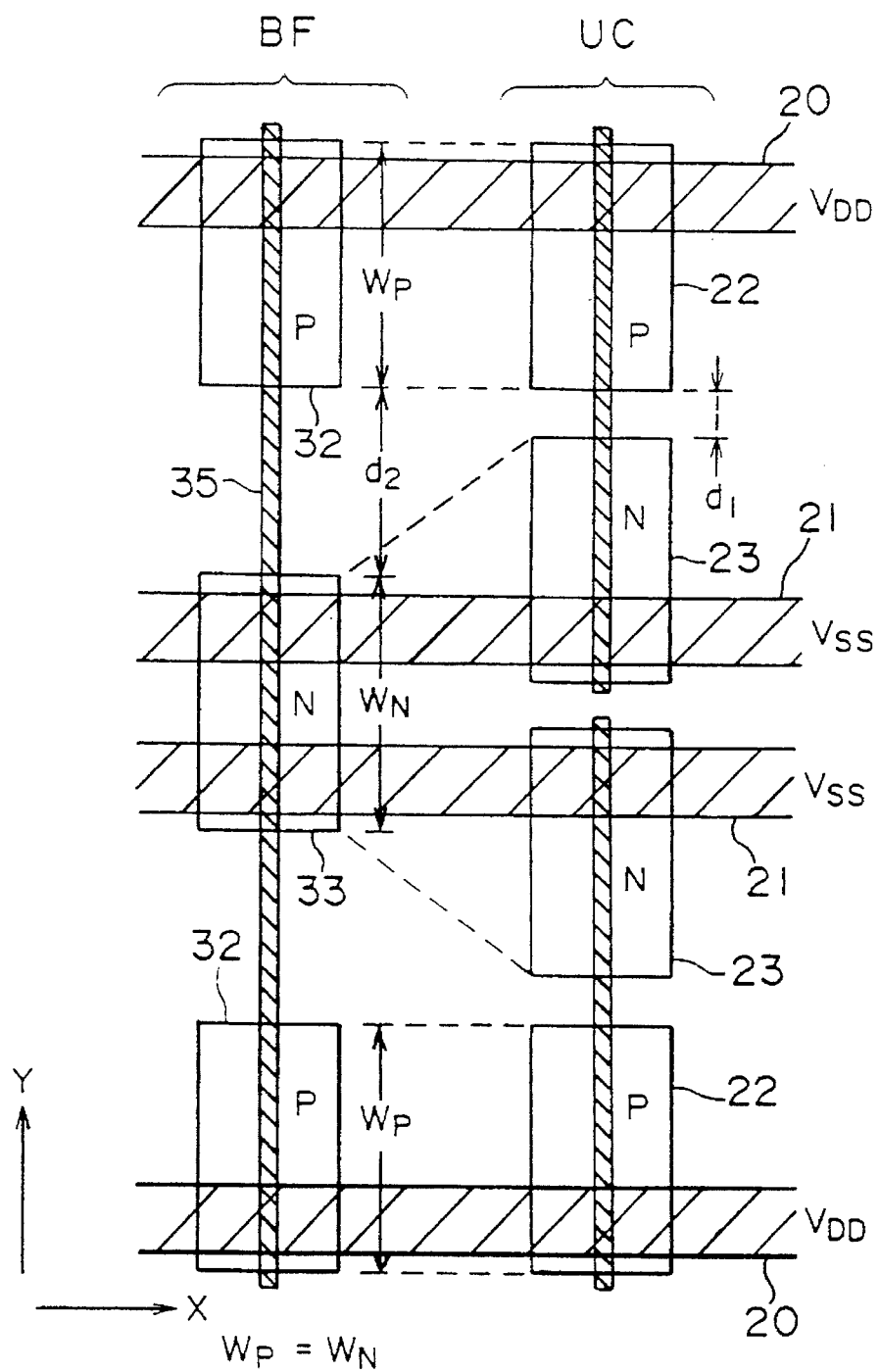
FIG. 6 is a plan view showing an essential part of a layout pattern of a first embodiment of a semiconductor circuit according to the present invention.

FIG. 6 shows an embodiment of the layout pattern of a buffer BF which is one of the input/output buffers and drives the 2-row type unit cell and the MCM. A first pair of power supply lines 20 and 21 and a second pair of power supply lines 20 and 21 are arranged in parallel to each other. The power supply line 20 supplies a power supply voltage $V_{DD}$, and the power supply line 21 supplies a power supply voltage $V_{SS}$. The power supply lines 20 and 21 run in a horizontal direction X. The two power supply lines 21 run in a horizontal direction X on the inside of the two power supply lines 20, relatively a vertical direction Y.

Each of 2-row type unit cells UC are arranged in the vertical direction Y, similarly as in the case of the conventional layout pattern described above. The 2-row type unit cell UC includes two p-channel transistors 22 which are connected to the corresponding power supply lines 20, and two n-channel transistors 23 which are connected to the corresponding power supply line 21. In other words, the 2-row-type unit cell UC is formed by 2 rows of basic cells. The p-channel transistors 22 have a transistor width $W_P$, and the n-channel transistor 23 have a transistor width $W_N$, where $W_P=W_N$.

On the other hand, the buffer BF includes two (2) p-channel transistors 32 which are connected to the corresponding power supply lines 20, and one (1) n-channel transistor 33 which is connected across the two power supply lines 21. These transistors 32 and 33 are arranged in the vertical direction Y. The p-channel transistors 32 have a transistor width $W_P$, and the n-channel transistor 33 has a transistor width $W_N$, where $W_P=W_N$. These transistor widths $W_P$ and $W_N$ of the p-channel transistors 32 and the n-channel transistor of the buffer BF are the same as the corresponding transistor widths $W_P$ and $W_N$ of the p-channel transistors 22 and the n-channel transistors 23 of the unit cell US.

Accordingly, the positions of the respective p-channel transistors 22 and 32 of the unit cell UC and the buffer BF along the vertical direction Y match. As for the n-channel transistors 23 and 33, there is only one (1) n-channel transistor 33 in the buffer BF as opposed to the two (2) n-channel transistors 23 of the unit cell UC. In addition, the n-channel transistor 33 of the buffer BF is located at a central portion along the vertical direction Y relatively to the two (2) n-channel transistors 23 of the unit cell UC. The two (2) p-channel transistors 32 of the buffer BF are connected via a gate wiring 35, and the two (2) p-channel transistors 33 are electrically connected in parallel.

Figures 7A, 7B:
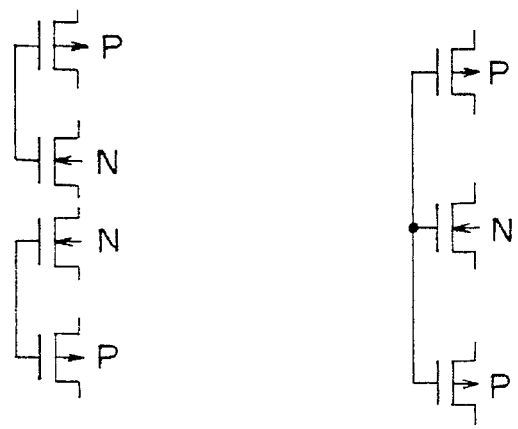
FIG. 7A and FIG. 7B respectively show equivalent circuit diagrams of a 2-row type unit cell and a buffer of the first embodiment.
Figure 8:
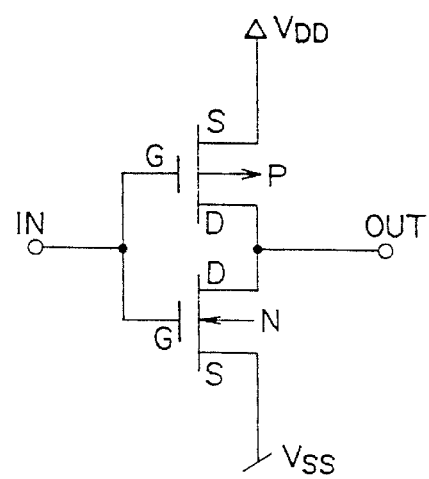
FIG. 8 is a circuit diagram of the buffer.

FIG. 7A shows an equivalent circuit diagram of the unit cell UC, and FIG. 7B shows an equivalent circuit diagram of the buffer BF.

Therefore, by employing the arrangement shown in FIG. 6, the p-channel transistors 32 of the buffer BF has in effect a transistor width $2W_P$ which is two times the transistor width $W_N$ of the n-channel transistor 33. As a result, the driving capabilities of the p-channel transistors 32 and the n-channel transistor 33 become the same. Hence, the rise time and the fall time of the signal waveform can be made approximately the same, thereby making it easy to design the system.

The transistors 32 and 33 of the buffer BF uses the power supply lines 20 and 21 in common with the transistors 22 and 23 of the unit cell UC. Moreover, the transistors 32 and 33 of the buffer BF can be arranged approximately side by side to the transistors 22 and 23 of the unit cell UC in the horizontal direction X. Accordingly, the transistors of the buffer BF will not project in the vertical direction Y or form a large unused region. For this reason, even if the buffers BF and the unit cells UC coexist on the semiconductor substrate, it is possible to maintain the high integration density which is realized when only the 2-row type unit cells are arranged in the layout pattern.

Furthermore, the relationship between a distance $d_1$ between the p-channel transistor 22 and the n-channel transistor 23 of the unit cell UC in the vertical direction Y and a distance $d_2$ between the p-channel transistor 32 and the n-channel transistor 33 of the buffer BF in the vertical direction Y becomes $d_1<d_2$. As a result, there is also an advantage in that a latch-up phenomenon is less likely to occur.

Figure 9:
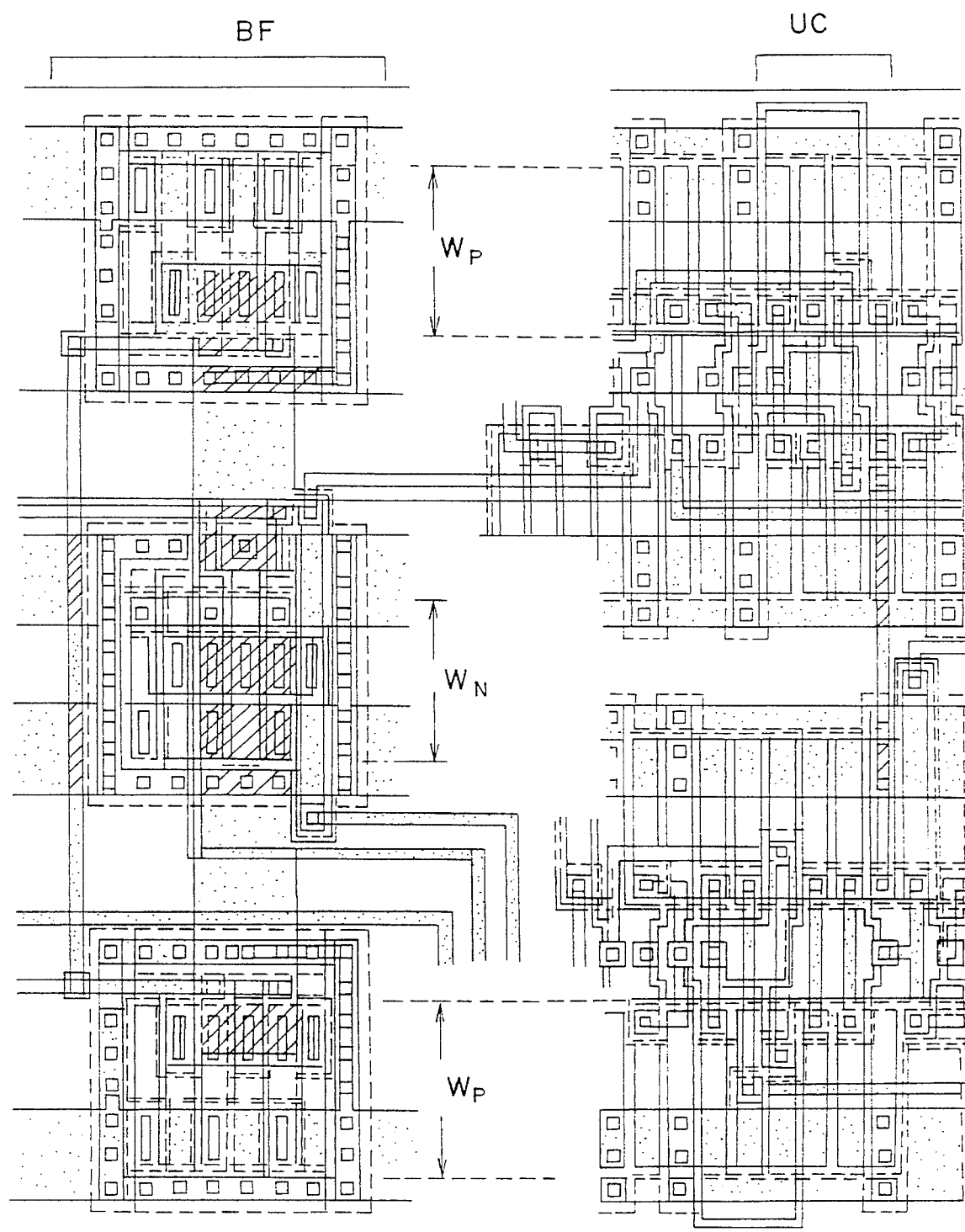
FIG. 9 is a plan view showing a layout pattern of a circuit which is applied with the first embodiment.

FIG. 9 shows a layout pattern of a circuit which is applied with the first embodiment having the layout pattern shown in FIG. 6. In FIG. 9, wirings are indicated by dotted (or shaded) portions.

Figure 10:
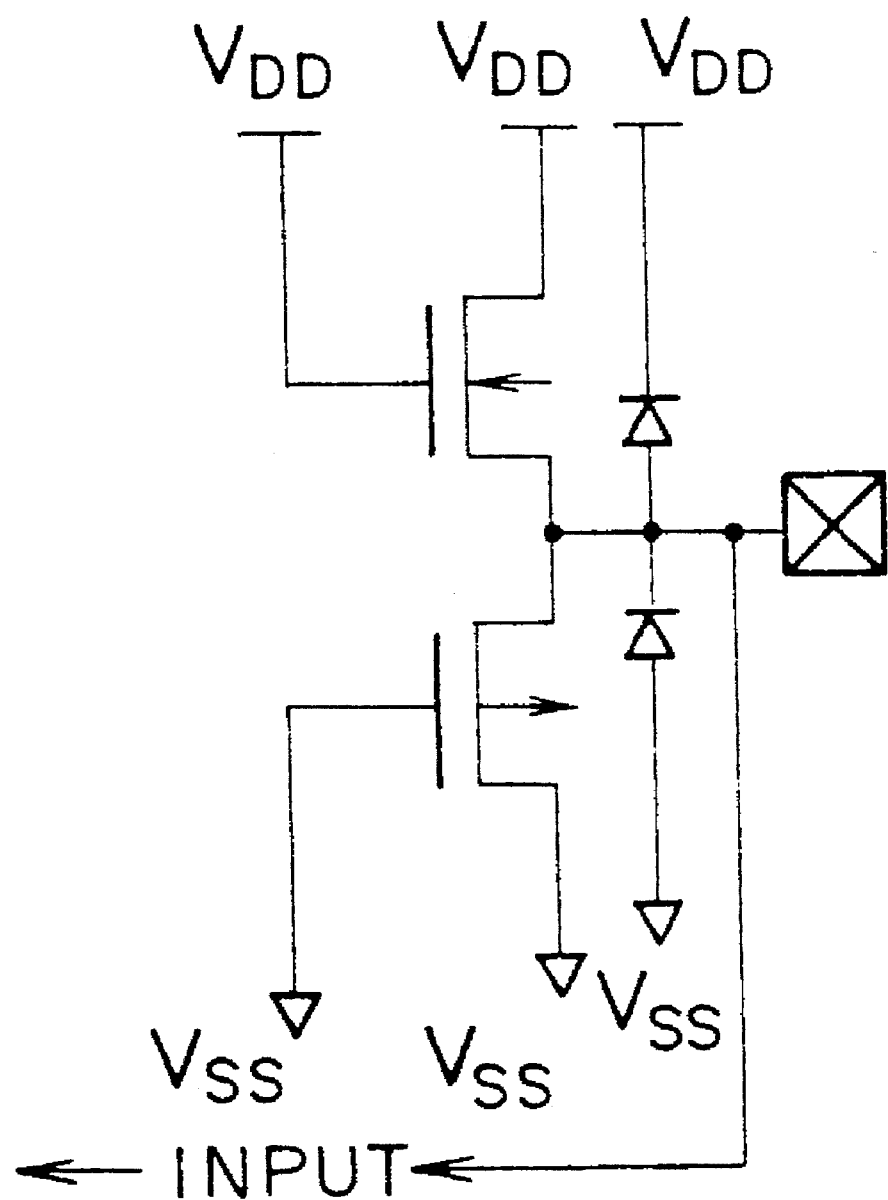
FIG. 10 is a circuit diagram showing an application to an input buffer.

As another application of this embodiment, it is possible to use the buffer BF as a diode for electrostatic protection (ESD) of an input buffer as shown in FIG. 10. In this case, however, the gate of the p-channel transistor 32 is clipped to the power supply voltage $V_{DD}$ and the gate of the n-channel transistor 33 is clipped to the power supply voltage $V_{SS}$, and the buffer BF does not operate as a buffer circuit.

Figure 11:
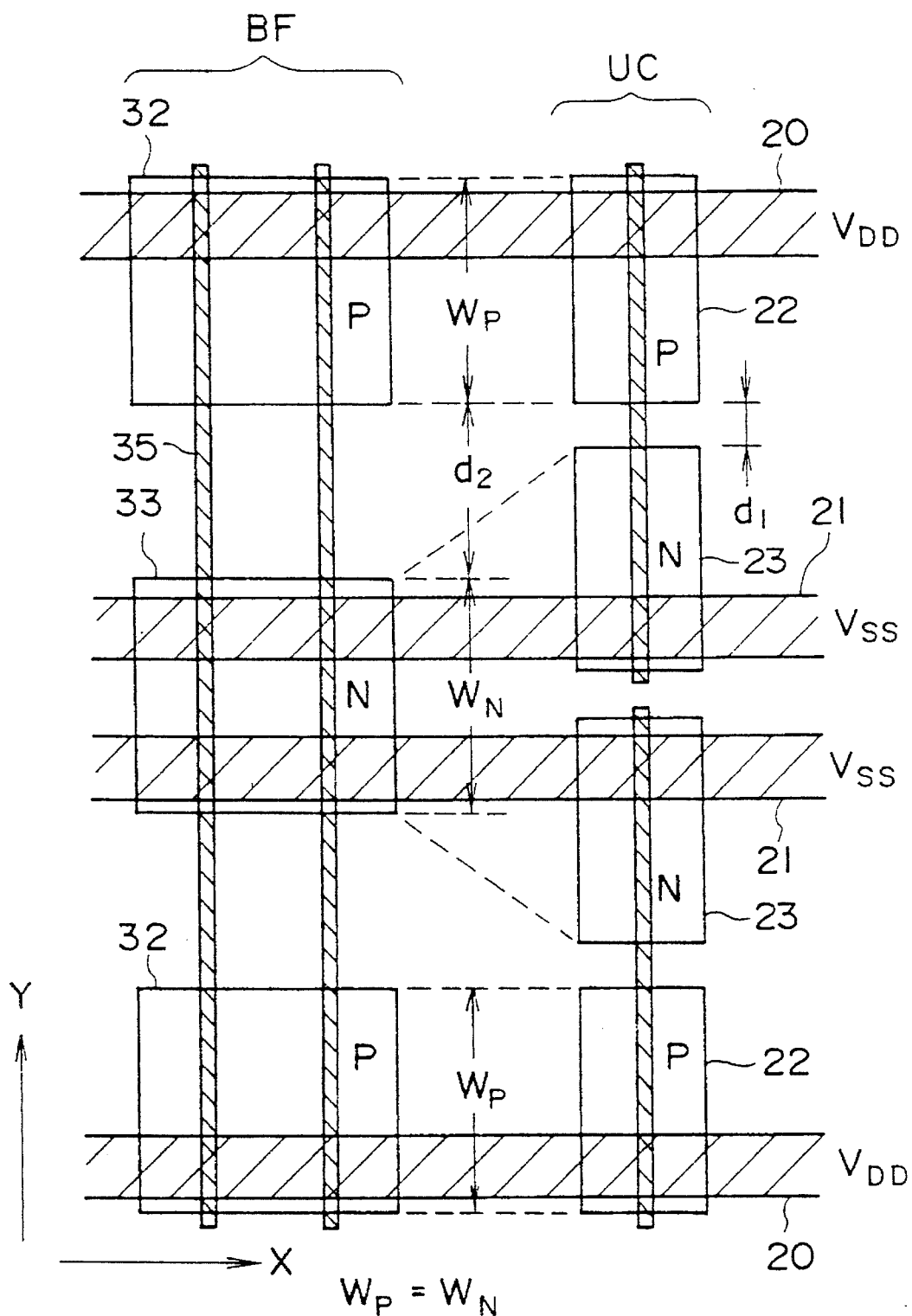
FIG. 11 is a plan view showing a layout pattern of a second embodiment of the semiconductor circuit according to the present invention.

Next, a description will be given of a second embodiment of the semiconductor circuit according to the present invention, by referring to FIG. 11. In FIG. 11, those parts which are the same as those corresponding parts in FIG. 6 are designated by the same reference numerals, and a description thereof will be omitted.

In this embodiment, the length of each of the p-channel and n-channel transistors 32 and 33 in the horizontal direction X in FIG. 11 is made two times that of the first embodiment shown in FIG. 6, so as to increase the driving capability of the buffer itself and to cope with a large load. Otherwise, this embodiment is basically the same as the first embodiment.

Figure 12:
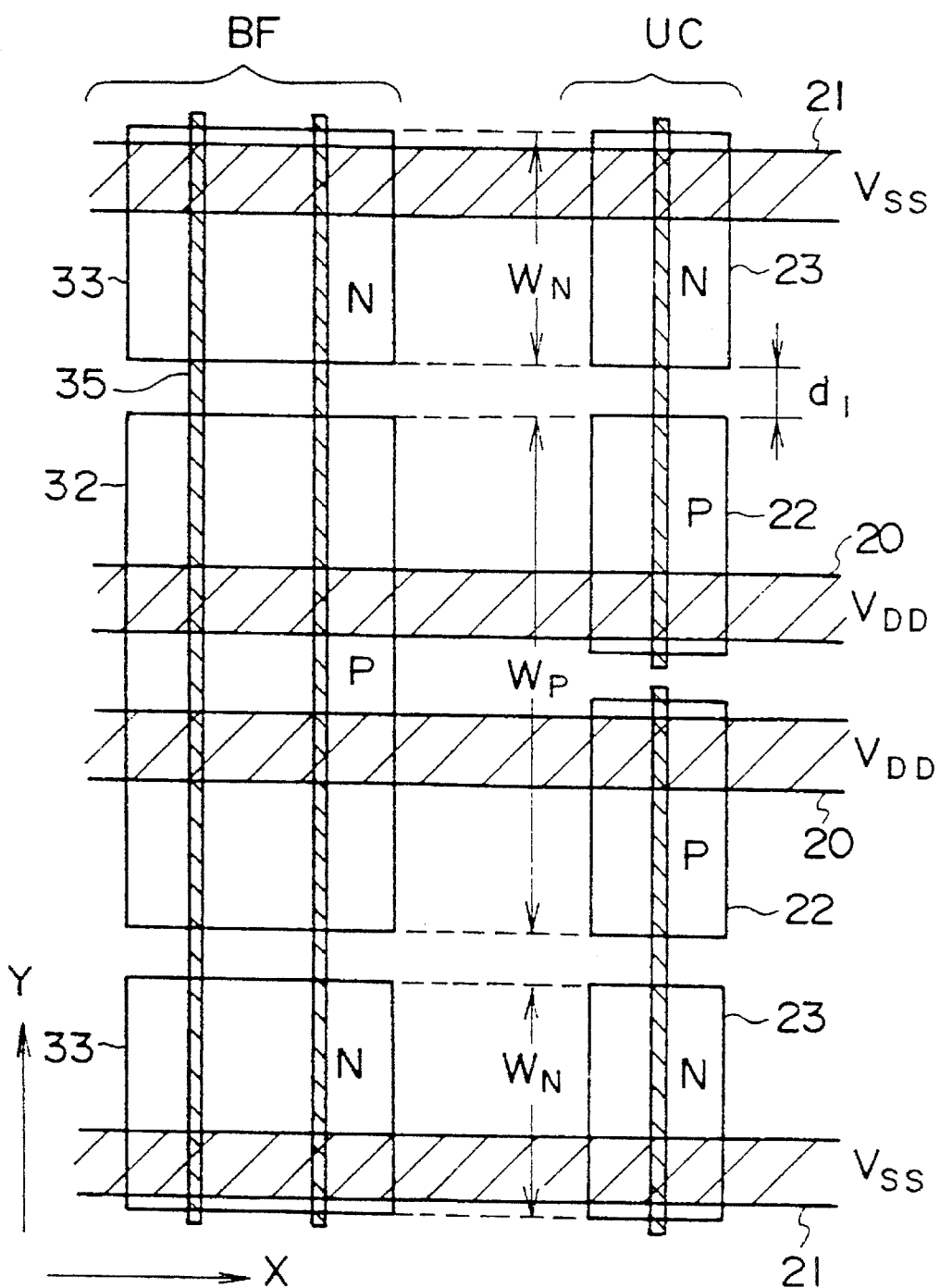
FIG. 12 is a plan view showing a layout pattern of a third embodiment of the semiconductor circuit according to the present invention.

Next, a description will be given of a third embodiment of the semiconductor circuit according to the present invention, by referring to FIG. 12. In FIG. 12, those parts which are the same as those corresponding parts in FIG. 6 are designated by the same reference numerals, and a description thereof will be omitted.

In this embodiment, the positions of the power supply lines 20 and 21 in the vertical direction Y are interchanged from those of the first embodiment shown in FIG. 6. Consequently, the positions of the p-channel transistors 22 and the n-channel transistors 23 of the unit cell UC are interchanged, and one (1) p-channel transistor 32 and two (2) n-channel transistors 33 are provided to form the buffer BF. The n-channel transistors 33 are connected via the gate wiring 35, and the two (2) n-channel transistors 33 are electrically connected in parallel. In addition, the length of each of the p-channel and n-channel transistors 32 and 33 in the horizontal direction X and the width of the p-channel transistor 32 in the vertical direction Y in FIG. 12 are respectively made two times those of the first embodiment shown in FIG. 6, so as to increase the driving capability of the buffer itself and to cope with a large load. The lengths of the p-channel and n-channel transistors 22, 23 and 33 are the same, and the width of the p-channel and n-channel transistors 22 and 23 are the same. Otherwise, this embodiment is basically the same as the first embodiment.

Figure 13:
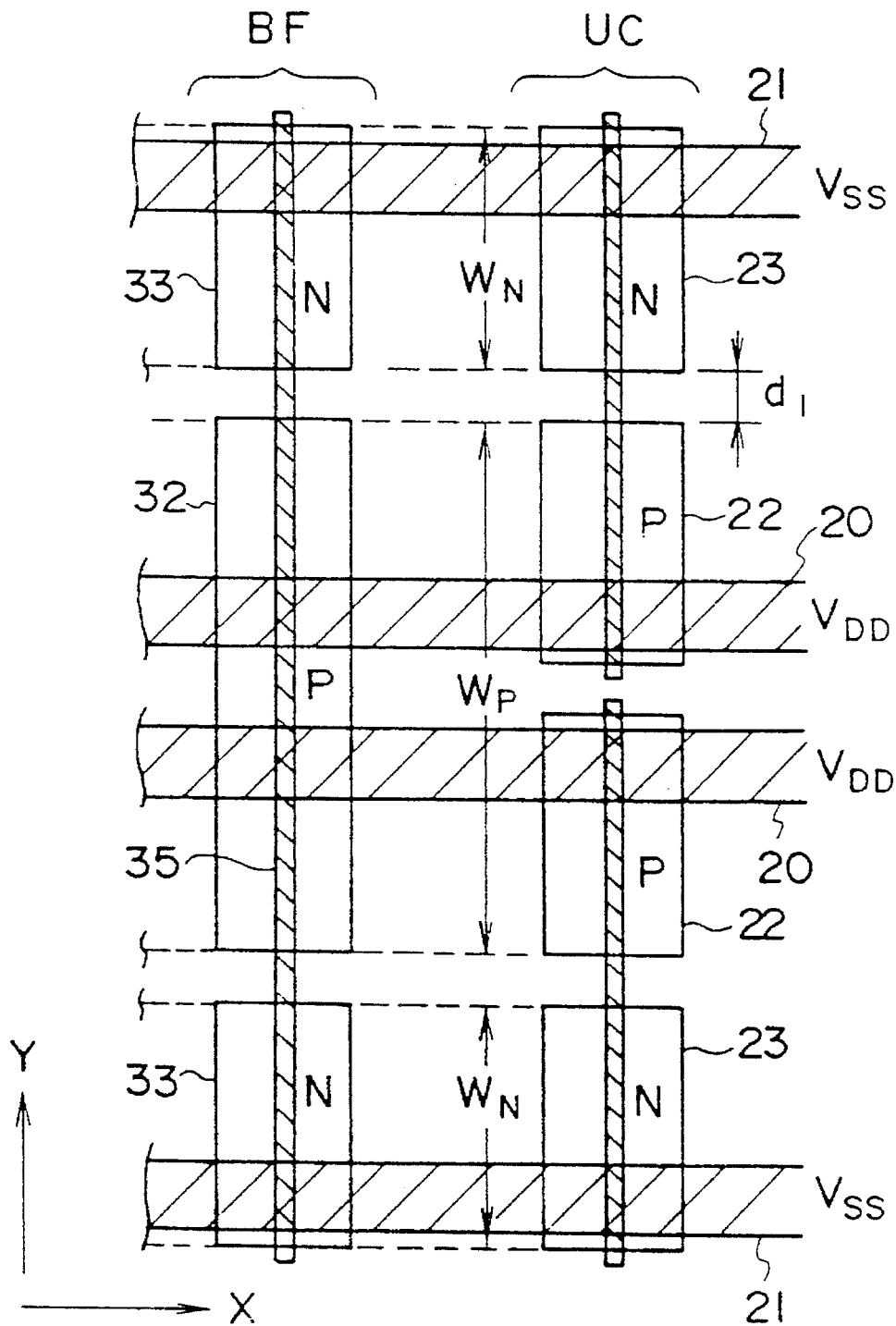
FIG. 13 is a plan view showing a layout pattern of a fourth embodiment of the semiconductor circuit according to the present invention.

Next, a description will be given of a fourth embodiment of the semiconductor circuit according to the present invention, by referring to FIG. 13. In FIG. 13, those parts which are the same as those corresponding parts in FIG. 6 are designated by the same reference numerals, and a description thereof will be omitted.

In this embodiment, the positions of the power supply lines 20 and 21 in the vertical direction Y are interchanged from those of the first embodiment shown in FIG. 6. Consequently, the positions of the p-channel transistors 22 and the n-channel transistors 23 of the unit cell UC are interchanged, and 1 p-channel transistor 32 and 2 n-channel transistors 33 are provided to form the buffer BF. The n-channel transistors 33 are connected via the gate wiring 35, and the 2 n-channel transistors 33 are electrically connected in parallel. In addition, the length of each of the p-channel and n-channel transistors 32 and 33 in the horizontal direction X in FIG. 13 is the same as that of the first embodiment shown in FIG. 6 and the width of the p-channel transistor 32 in the vertical direction Y is made two times that of the first embodiment, so as to increase the driving capability of the buffer itself and to cope with a large load. Otherwise, this embodiment is basically the same as the first embodiment.

Figure 14A:
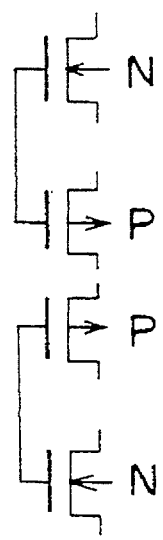
FIG. 14A and FIG. 14B respectively show equivalent circuit diagrams of a 2-row type unit cell and a buffer of the third and fourth embodiments.
Figure 14B:
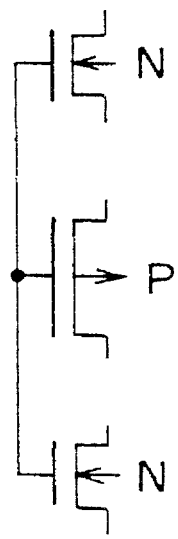

FIG. 14A shows an equivalent circuit diagram of the unit cell UC of the third and fourth embodiments shown in FIGS. 12 and 13. On the other hand, FIG. 14B shows an equivalent circuit diagram of the buffer BF of the third and fourth embodiments shown in FIGS. 12 and 13.

Therefore, according to these second, third and fourth embodiments, even if the buffers BF and the unit cells UC coexist on the semiconductor substrate, it is also possible to maintain the high integration density which is realized when only the 2-row type unit cells are arranged in the layout pattern, because the space utilization efficiency is high.

Of course, the present invention is not limited to the application to the buffer which drives the MCM. Effects similar to those described above can be obtained by employing the above described layout patterns when driving a signal line such as a clock signal line within the LSI which has a large load. In other words, the present invention may be applied to the input buffer of the ESD protection circuit shown in FIG. 10, the clock buffer of the LSI and the like.

Next, a description will be given of fifth and sixth embodiments of the semiconductor circuit according to the present invention in which the present invention is applied to a gate array.

Figure 15:
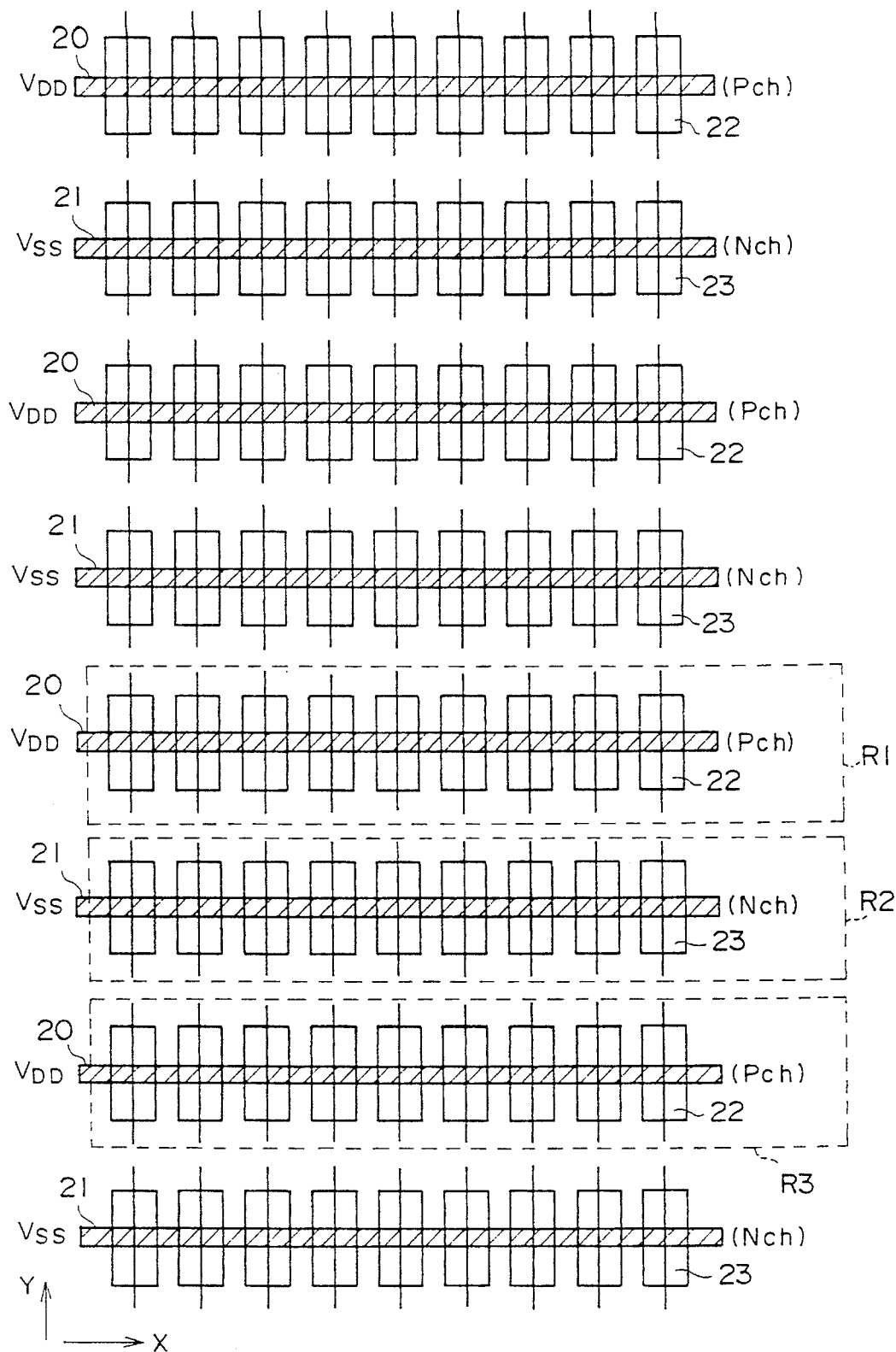
FIG. 15 is a plan view showing a layout pattern of a bulk structure of a semiconductor circuit.

FIG. 15 shows a bulk structure of a gate array. In FIG. 15, those parts which are the same as those corresponding parts in FIG. 6 are designated by the same reference numerals, and a description thereof will be omitted.

In FIG. 15, the p-channel transistors 22 and the n-channel transistors 23 are both arranged in the horizontal direction X and are alternately arranged in the vertical direction Y. The p-channel and n-channel transistors 22 and 23 all have the same length in the horizontal direction X and the same width in the vertical direction Y.

When designing a CMOS (Complementary Metal Oxide Semiconductor) circuit, the same number of p-channel transistors and n-channel transistors are used in general. However, in order to set the rise time and the fall time of the signal waveform approximately same for the purpose of avoiding unwanted delays at the input/output buffer or maintaining the duty ratio of the signal constant at a clock driver, for example, it becomes necessary to use more p-channel transistors than the n-channel transistors. However, even if more p-channel transistors are used compared to the n-channel transistors, it is still necessary to realize an efficient layout pattern so that unused transistors and wasted (or unused) regions are minimized on the gate array.

Figure 16:
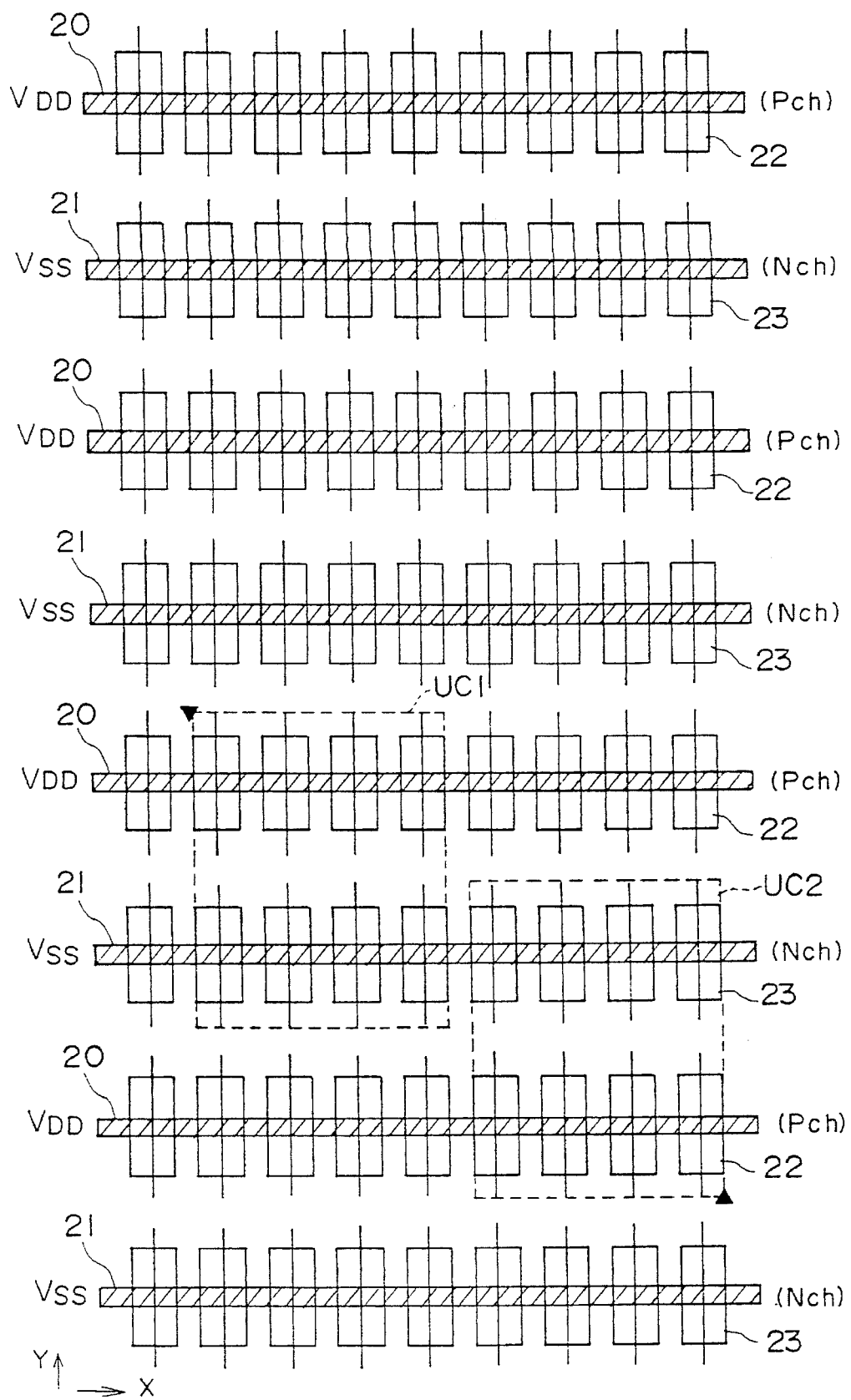
FIG. 16 is a plan view showing a layout pattern of unit cells of a fifth embodiment of the semiconductor circuit according to the present invention using the bulk structure shown in FIG. 15.

In the fifth embodiment, a unit cell UC1 can be formed by use of the same number of p-channel transistors 22 and n-channel transistors 23 of first and second rows R1 and R2 shown in FIG. 15, as indicated by a dotted line in FIG. 16. Similarly, a unit cell UC2 can be formed by use of the same number of p-channel transistors 22 and n-channel transistors 23 of second and third rows R2 and R3 shown in FIG. 15, as indicated by a dotted line in FIG. 16. In other words, the positions of the unit cells UC1 and UC2 can be shifted in the vertical direction Y. For this reason, even if a buffer or the like using a different number of p-channel transistors 22 and n-channel transistors 23 is formed on the gate array, it is possible to eliminate the unused region which would be formed by the provision of such a buffer by appropriately shifting the positions of the unit cells.

Figure 17:
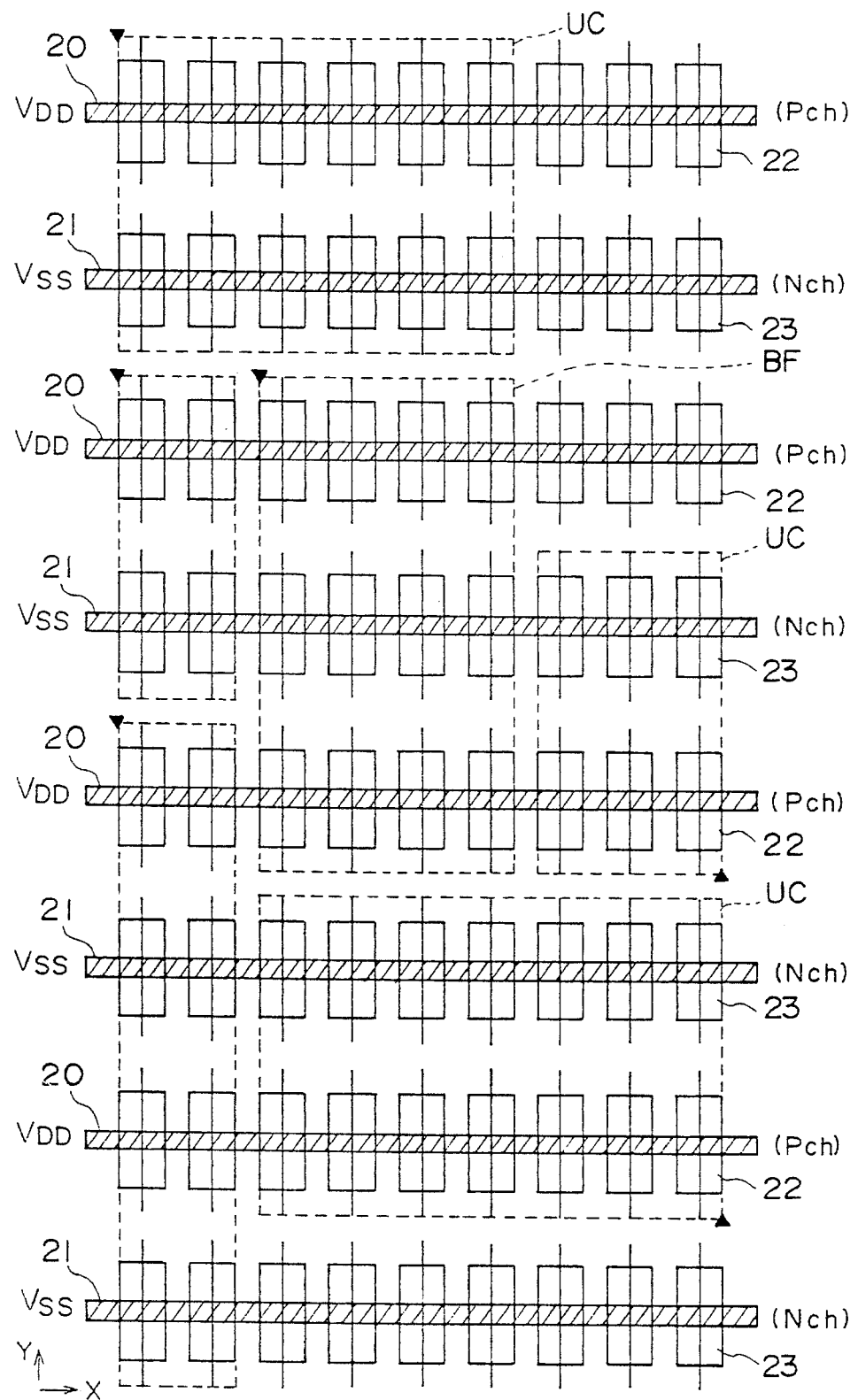
FIG. 17 is a plan view showing a layout pattern of a circuit which is applied with the fifth embodiment.

FIG. 17 shows a layout pattern of a circuit which is applied with the fifth embodiment. In this case, a buffer (or cell) BF uses two times more p-channel transistors 22 compared to n-channel transistors 23. However, the unit cells UC can be arranged as shown by appropriately shifting the positions of the unit cells UC in the vertical direction Y where necessary, so that the unused region on the gate array is minimized. In other words, the provision of the buffer BF does not increase the unused region on the gate array.

Figure 18:
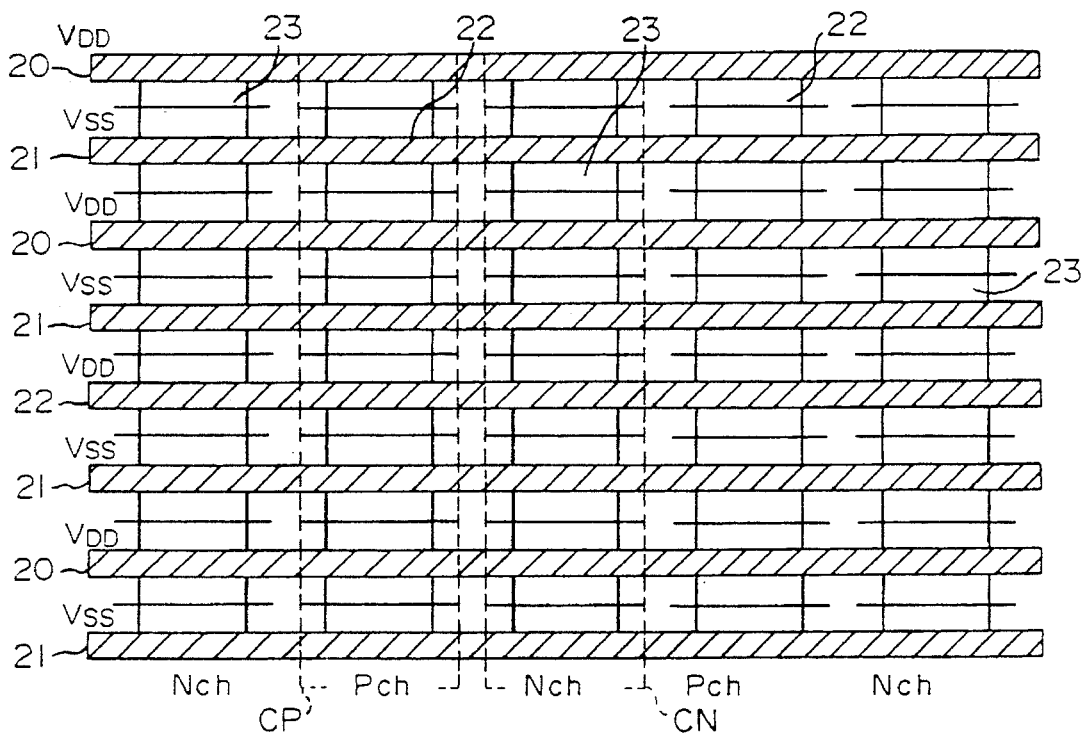
FIG. 18 is a plan view showing a layout pattern of another bulk structure of a semiconductor circuit.

FIG. 18 shows another bulk structure of a gate array. In FIG. 18, those parts which are the same as those corresponding parts in FIG. 6 are designated by the same reference numerals, and a description thereof will be omitted.

In FIG. 18, the p-channel transistors 22 and the n-channel transistors 23 are both arranged in the vertical direction Y and are alternately arranged in the horizontal direction X. The p-channel and n-channel transistors 22 and 23 all have the same length in the horizontal direction X and the same width in the vertical direction Y. Furthermore, each of the p-channel and n-channel transistors 22 and 23 have an elongated shape extending in the horizontal direction X, as opposed to the p-channel and n-channel transistors 22 and 23 which have an elongated shape extending in the vertical direction Y in FIG. 15.

Figure 19:
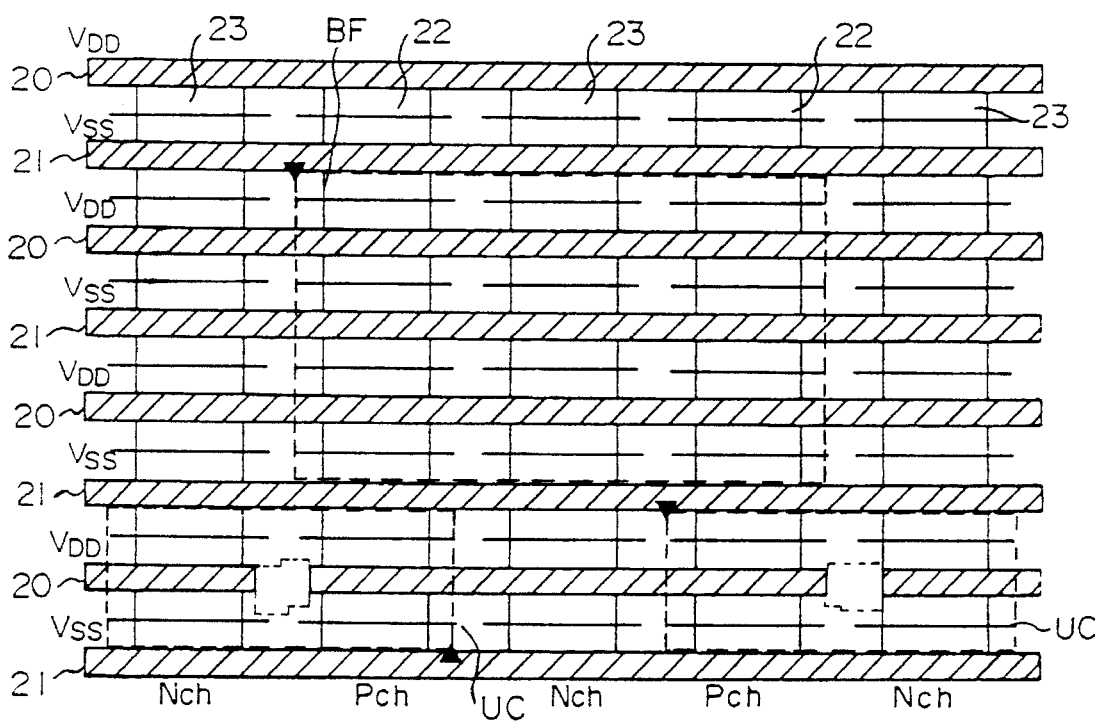
FIG. 19 is a plan view showing a layout pattern of a sixth embodiment of the semiconductor circuit according to the present invention using the bulk structure shown in FIG. 17.

FIG. 19 shows a layout pattern of a circuit which is applied with the sixth embodiment. In this case, a buffer (or cell) BF uses two times more p-channel transistors 22 compared to n-channel transistors 23. However, the unit cells UC can be arranged as shown by appropriately shifting the positions of the unit cells UC in the horizontal direction X where necessary, so that the unused region on the gate array is minimized. In other words, the provision of the buffer BF does not increase the unused region on the gate array.

Therefore, according to the fifth and sixth embodiments, the unit cells UC and the buffers BF are formed so that arbitrary and mutually adjacent rows of p-channel transistors 22 and n-channel transistors 23 are used symmetrically in the layout pattern. Hence, a high gate utilization efficiency can be realized regardless of the ratio of the p-channel and n-channel transistors 22 and 23 used by a certain cell, buffer or the like.

Of course, in FIGS. 15 through 19, each of the p-channel transistors 22 and n-channel transistors 23 may be a gate and not a transistor.

Further, the present invention is not limited to these embodiments and various variations and modifications may be made without departing from the scope of the present invention.

What is claimed is:

1. A semiconductor circuit comprising:
   a plurality of first power supply lines which are arranged in parallel to each other and supplying a power supply voltage;

a plurality of second power supply lines which are arranged in parallel to each other and supply a power supply voltage different from that supplied by said first power supply lines, said first and second power supply lines running in parallel to each other in a first direction;

a first cell made up of the same number of first p-channel transistors and first n-channel transistors which are respectively coupled to said first and second power supply lines, said first p-channel transistors and said first n-channel transistors being alternately arranged in a second direction and having the same size; and a second cell made up of a first number of second p-channel transistors and a second number of second n-channel transistors which are respectively coupled to said first and second power supply lines, said second p-channel transistors and said second n-channel transistors being alternately arranged in said second direction, said first number and said second number being different;

said second p-channel transistors being electrically coupled in parallel, so that said second p-channel transistors have a predetermined driving capability.

2. The semiconductor circuit as claimed in claim 1, wherein said second p-channel transistors and said second n-channel transistors have the same size as said first p-channel transistors and said first n-channel transistors.

3. The semiconductor circuit as claimed in claim 1, wherein said second p-channel transistors and said second n-channel transistors have a length greater than that of said first p-channel transistors and said first n-channel transistors when said length is taken along said first direction.

4. The semiconductor circuit as claimed in claim 3, wherein said second p-channel transistors have a width greater than that of said first p-channel transistors and said first n-channel transistors when said width is taken along a direction perpendicular to said first direction.

5. The semiconductor circuit as claimed in claim 1, wherein said second p-channel transistors have a width greater than that of said first p-channel transistors and said first n-channel transistors when said width is taken along a direction perpendicular to said first direction.

6. The semiconductor circuit as claimed in claim 5, wherein said second n-channel transistors have the same size as said first p-channel transistors and said first n-channel transistors, and said second p-channel transistors have the same length as the length of said first p-channel transistors, said first n-channel transistors and said second n-channel transistors when said length is taken along said first direction.

7. The semiconductor circuit as claimed in claim 1, wherein said predetermined capability of said second p-type transistors is approximately two times that of said second n-type transistors.

8. The semiconductor circuit as claimed in claim 1, wherein said second direction is perpendicular to said first direction.

9. The semiconductor circuit as claimed in claim 8, wherein two said second power supply lines are provided between two said first power supply lines, and said second n-type transistor is arranged to partially overlap said two second power supply lines between two said second p-type transistors.

10. The semiconductor circuit as claimed in claim 8, wherein two said first power supply lines are provided between two said second power supply lines, and said second p-type transistor is arranged to partially overlap said two first power supply lines between two said second n-type transistors.

11. The semiconductor circuit as claimed in claim 8, wherein a plurality of said first cells are arranged so that positions of arbitrary and mutually adjacent first cells are shifted along said second direction.

12. The semiconductor circuit as claimed in claim 1, wherein said second direction is parallel to said first direction.

13. The semiconductor circuit as claimed in claim 12, wherein a plurality of said first cells are arranged so that positions of arbitrary and mutually adjacent first cells are shifted along said first direction.

* * * * *

UNITED STATES PATENT AND TRADEMARK OFFICE
CERTIFICATE OF CORRECTION

PATENT NO. : 5,489,860
DATED : Feb. 6, 1996
INVENTOR(S) : KITAGAWA et al.

It is certified that error appears in the above-indentified patent and that said Letters Patent is hereby corrected as shown below:

Col. 1, line 6, after "circuits" delete the comma (",").

Col. 2, line 7, after "uses" delete "the" (first occurrence);
line 9, after "uses" delete "the".

Col. 4, line 64, change "(1) one" to --one (1)--.

Col. 5, line 9, after "relatively" insert --to--;
line 30, after "sistor" insert --33--.

Signed and Sealed this

Thirtieth Day of July, 1996

Attest:

BRUCE LEHMAN

Attesting Officer

Commissioner of Patents and Trademarks